United States Patent
Trent et al.

(10) Patent No.: US 9,562,951 B2
(45) Date of Patent: Feb. 7, 2017

(54) DIGITAL FREQUENCY RESPONSE ANALYSIS SYSTEM AND METHOD USEFUL FOR POWER SUPPLIES

(71) Applicants: Manfred Trent, Austin, TX (US); Michael Gray, Austin, TX (US)

(72) Inventors: Manfred Trent, Austin, TX (US); Michael Gray, Austin, TX (US)

(73) Assignee: Venable Corporation, Austin, TX (US)

( * ) Notice: Subject to any disclaimer, the term of this patent is extended or adjusted under 35 U.S.C. 154(b) by 67 days.

(21) Appl. No.: 14/614,158

(22) Filed: Feb. 4, 2015

(65) Prior Publication Data

US 2015/0260801 A1  Sep. 17, 2015

Related U.S. Application Data

(60) Provisional application No. 61/951,407, filed on Mar. 11, 2014.

(51) Int. Cl.
*G01R 31/40* (2014.01)
*G01R 23/16* (2006.01)

(52) U.S. Cl.
CPC .............. *G01R 31/40* (2013.01); *G01R 23/16* (2013.01)

(58) Field of Classification Search
CPC .......... G01R 31/04; G01R 23/16; G01R 31/40
See application file for complete search history.

(56) References Cited

U.S. PATENT DOCUMENTS

| | | | |
|---|---|---|---|
| 3,808,526 A | 4/1974 | Jackson | |
| 5,663,727 A * | 9/1997 | Vokac | G01R 23/16 341/132 |
| 5,905,967 A | 5/1999 | Botham | |
| 7,772,928 B2 | 8/2010 | Ortler | |
| 8,261,119 B2 | 9/2012 | Wamoto | |
| 2005/0240852 A1 | 10/2005 | Miyazaki | |
| 2010/0074387 A1* | 3/2010 | Mendel | H03L 7/085 375/376 |

OTHER PUBLICATIONS

PCT/US2015/019945 International Search Report mailed Jun. 17, 2015; 1 page.

* cited by examiner

*Primary Examiner* — Christopher Mahoney (57) ABSTRACT

A frequency response analyzer includes a signal generator, a reference channel module, and a digital frequency response analyzer. The signal generator includes an input, a first output to provide an output signal to a unit under test, and a second output to provide a first synchronization signal. The reference channel module includes an input coupled to the first output of the signal generator, and an output to provide phase information data of the output signal. The digital frequency response analyzer includes a first input to receive the first synchronization signal, and a second input to receive digitized analog data from the unit under test. A processor of the frequency response analyzer correlates received digitized analog data to received analog data based on the phase, and determines a transfer function of the plant of the unit under test based on the correlation of received digitized analog data and received analog data.

20 Claims, 3 Drawing Sheets

DIGITAL FREQUENCY RESPONSE ANALYSIS SYSTEM AND METHOD USEFUL FOR POWER SUPPLIES

CROSS REFERENCE TO RELATED APPLICATIONS

This application claims priority to U.S. Provisional Patent Application No. 61/951,407, entitled "Digital Frequency Response Analysis System and Method Useful for Power Supplies," filed on Mar. 11, 2014, the disclosure of which is hereby expressly incorporated by reference in its entirety.

FIELD OF THE DISCLOSURE

This disclosure relates generally to digital feedback loop stabilization. More particularly, embodiments disclosed herein relate to a new digital frequency response analyzer for digital feedback loop stabilization.

FIELD OF THE DISCLOSURE

This disclosure relates generally to digital feedback loop stabilization. More particularly, embodiments disclosed herein relate to a new digital frequency response analyzer for digital feedback loop stabilization.

BACKGROUND

Power supplies have typically been designed using analog components. An analog Frequency Response Analyzer (FRA) is utilized by design engineers to achieve optimum performance and limit failure situations in the design of such analog power supplies.

Increasingly, some of the analog control components in power supplies are being replaced with microcontroller-based solutions to provide more versatility in design solutions and provide real-time status and control of power supplies from external systems. Analog Frequency Response Analyzers are unable to connect to and capture information in key locations in power supply designs utilizing these digital solutions. Hence, they are limited in their measurement abilities of digital designs to provide the necessary detailed data for accurate design implementation by the engineer.

In particular, currently, there are no solutions in existence for performing complete loop/gain (FRA) measurement on power implementations utilizing microprocessors. Use of an Analog FRA provides only limited loop measurement capability, insufficient for most design work.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

The disclosure and the various features and advantageous details thereof are explained more fully with reference to the non-limiting embodiments that are illustrated in the accompanying drawings and detailed in the following description. Descriptions of well-known starting materials, processing techniques, components and equipment are omitted so as not to unnecessarily obscure the disclosure in detail. It should be understood, however, that the detailed description and the specific examples, while indicating some embodiments of the disclosure, are given by way of illustration only and not by way of limitation. Various substitutions, modifications, additions and/or rearrangements within the spirit and/or scope of the underlying inventive concept will become apparent to those skilled in the art from this disclosure.

A Digital Frequency Response Analyzer (DFRA) according to embodiments provides for digital feedback loop stabilization of digital controllers. Such feedback loop stabilization has applicability, for example, with power supplies and motion controllers. In that follows, embodiments including power supplies are discussed, although embodiments are not limited to such applications. As such, the figures are exemplary only.

A DFRA according to embodiments interfaces to a microcontroller section of a digital-based power supply design and extracts information to perform an accurate analysis of a power supply design and provide the required results to optimize their design.

Figure 1:
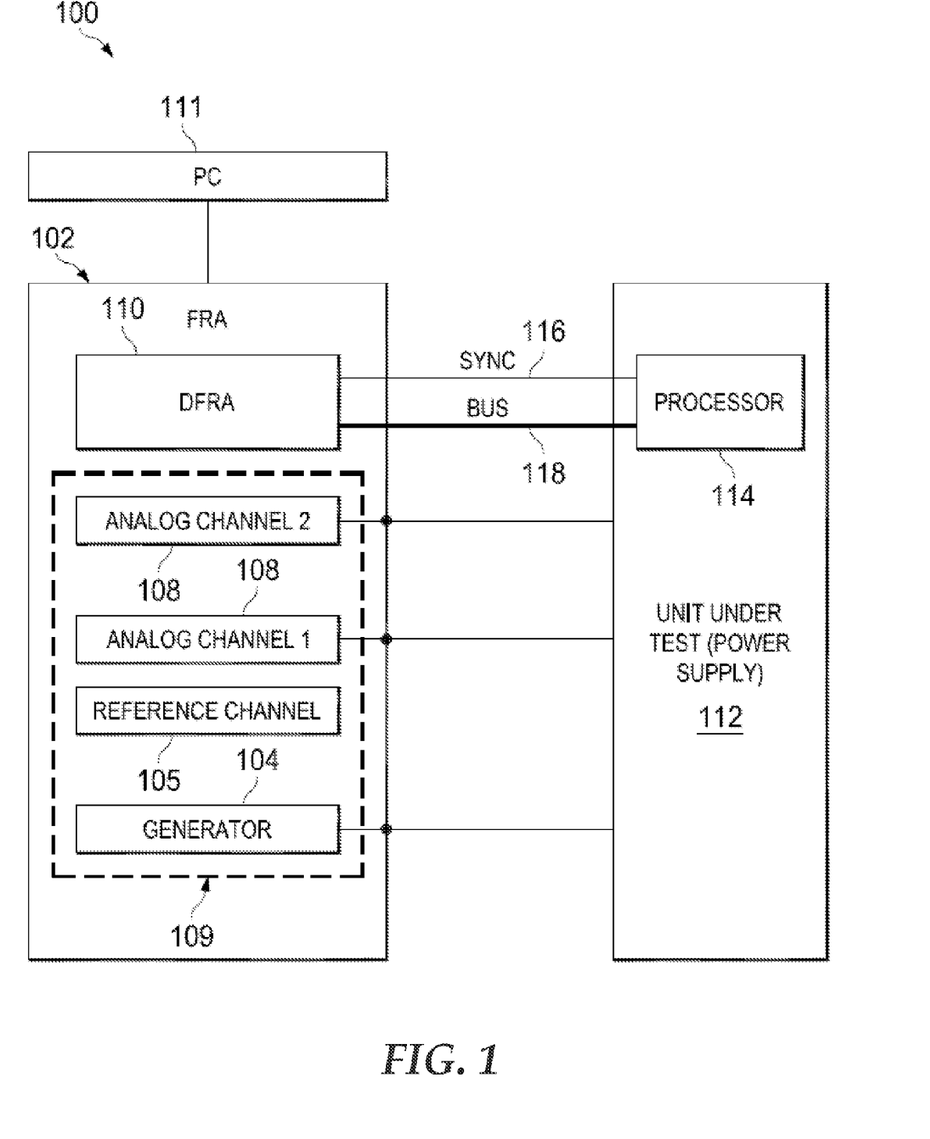
FIG. 1 depicts a diagrammatic representation of a digital frequency response analysis system according to some embodiments.

Turning now to the drawings and with particular attention to FIG. 1, a frequency response analysis system according to some embodiments is shown and generally identified by the reference numeral 100. As shown, the frequency response analysis system 100 includes a frequency response analyzer (FRA) 102 that may implement both analog and digital frequency response analysis functionality. In an embodiment, an individual can toggle the FRA 102 between implementing analog frequency response analysis functionality, and implementing digital frequency response analysis functionality. The frequency response analysis system 100 further includes a unit under text (UUT) 112, typically a power supply including a processor 114.

To perform a frequency analysis on the UUT 112, the FRA 102 includes an analog Frequency Response Analyzer portion (AFRA) 109, which supports a plurality of channels, including a generator 104, a reference channel 105, one or more analog channels 108, and a digital frequency response analyzer 110. Each of the reference and analog channels is essentially a measuring device. In some embodiments, outputs from the FRA 102 may be provided to a communicatively coupled computer 111, such as a PC.

The generator 104 and analog channels 108 are used to provide signal injection directly to analog portions of the UUT 112 and control measurements of analog portions of the UUT 112. In particular, the generator 104 can provide or inject an analog output signal from the FRA 102 to the UUT 112, and the analog channels 108 can receive analog measurements from the UUT 112 in response to the injection of the analog output signal. In addition, the AFRA 109 provides synchronization and measurement control to the DFRA 110. In an embodiment, the synchronization and measurement control can be provided from the AFRA 109 to the DRFA 110 via a synchronization signal. The reference channel 105 is used to correlate the analog information with the digital information, so that analog data may be combined with digital data for analysis, such as determining the transfer function in a particular section of the control loop. In an embodiment, a particular section of a control loop of the UUT 112 can be referred to as a plant of the UUT 112. To do so, the reference channel 105 receives inputs from the generator 104 and monitors the sinusoidal signal identifying the phase of the signal in order to synchronize or relate the analog signals to the digital signals.

In the embodiment illustrated, the DFRA 110 interfaces to UUT 112 via a communication bus 118 and a synchronization bus 116. The DFRA 110 accepts control commands from the AFRA 109 to initiate digital layer measurements. The DFRA 110 further utilizes first level synchronization from synchronization signal of the AFRA 109 to generate a second level synchronization signal on the sync bus 116 to the UUT 112. In addition, the DFRA 110 sends commands to the UUT 112 to initiate data sampling within the UUT 112 and receives result data from the UUT 112 through the communication bus. In an embodiment, the commands can be provided from the DFRA 110 to the UUT 112 via a digital command signal. In an embodiment, the digital command signal can be generated by the DFRA 110 based on the first synchronization signal received from generator 104 of the AFRA 109.

The result data are processed into gain/phase information to be shipped to the AFRA 109's processor (not shown).

Data from the FRA 102 may be provided to a communicatively coupled device such as a personal computer 111.

In some embodiments, the FRA 102 samples one cycle of an injection signal, typically a sine wave, from the generator 104. To do this, the generator 104 generates a synchronization signal, herein referred to the 'generator sync', indicating a state change at each zero-cross of the generator signal. This synchronization signal is a square wave that is frequency and phase locked to the generator 104's sine wave output. This signal is used by the DFRA 110 to detect when to begin and halt one set of sample data. In an embodiment, the generator signal can be an analog test signal. In an embodiment, it can be understood that the generator 110 includes a buffer or driver that receives the generator signal, and that the buffer or driver then provides the generator signal, e.g., the analog test signal, as an output signal on an external terminal of the FRA 102, which in turn can provide the output signal to the UUT 112.

The DFRA 110 may generate a series of sample synchronization pulses via the sync bus 116 to the UUT 112. In some embodiments, the series of sample sync pulses may begin with the positive transition of the generator sync signal, e.g., the synchronization signal from the generator 104 to the DFRA 110, and end with the next positive transition of the generator sync signal. In some embodiments, the number of sample sync pulses per series is kept between 128 and 256, with this number being determined according to an internal algorithm that computes the optimum sample size to assure amplitude and phase accuracy of the sample set. In other embodiments, the number of sample sync pulses per series is kept between 64 and 256. Generated frequencies below 500 Hz are over-sampled and above 500 Hz are Equivalent Time Sampled. The samples, then, are representative of the sine wave and allow for determining frequency and phase of the measured signals.

The DFRA 110 may include firmware to compensate for data measurement latency created by the DFRA 110 and the UUT 112. Aspects of DFRA firmware may be found in Table 1 below:

TABLE 1

```
//=========== Main Program =================
main( )
{
    Copy time-critical routines from Flash to Ram Memory
    Initialize processor hardware interfaces
    Initialize all active communication bus interfaces
    Initialize communication data structures
    Configure Oversampling Interrupt handlers - Timers and Triggers
    Configure EquivalentTimeSampling Interrupt handlers - Timers and Triggers
    Enable Interrupts
    for ( ever )
    {
        Toggle the activity LED
        Call routine to handle communication to/from Frequency Response Analyzer CPU
        switch active operation state
        {
            Waiting for command
            {
            if this is a command to do initial setup
                reset variables
                extract injection frequency
                extract integration time
                set next state to query for baseline data from target
            if this is a command is to begin sampling
                Initialize parameters
                set up sampling timer
                set next state to begin sampling
                reset communication buffer
        }
        Query for baseline data
        {
            Send request to target for baseline data
```

TABLE 1-continued

```
}
Acknowledge reception of command
{
    If we have received baseline data, store the values
    Send message to Frequency Response Analyzer Cpu, acknowledging
    command received
    Set next state to wait for transmission to complete
}
Transitioning
{
    Reset parameters
    set up sampling timer
    set next state to begin sampling
}
Begin Sampling
{
    Send message to target to begin its sampling
    Set next state to wait for response message from target
}
Prepare for synchronization
{
    Wait for sampling timer to begin
    Set next state to sampling in progress
}

Sampling in Progress
{
    Wait for next synchronization signal from FRA CPU
    If we have receive the signal
        Record the number of samples accumulated
    Set next state to End Sampling
}
End Sampling
{
    Send message to target that sampling activity is complete
    Set next state to wait for response message from target
}
Check if results in target are ready:
{
    Deactivate timers
    Reset interrupts
    Send message to target to find out if result data is ready
    Set next state to wait for response message from target
}
Initiate transfer of data from target:
{
    if result data is ready and available
        Send message to target to transfer the result data
        Set next state to wait for response message from target
}
Receive data from target
{
    Capture and Store the data
    Set next state to process data
}
Process data from target
{
    If the number of samples is not within predicted constraints
        There was an error.
        Rerun the sampling by setting next state to Transitioning
    else
        If the number of samples was too low or too high
            There was probably a synchronization error
            Call DoTimerError to make adjustment
        else
            Store the data to memory
            Set next state to do computational work on data
}
Do Computations
{
    Call routine to Compensate data for latency introduced by Digital FRA
    board
    Call routine to Compensate data for latency introduced by Target
    processor under test
    Call routine to rescale data
    Run the first stage of a DFT on the data already collected
    if we have another integration cycle of data to collect
        Set next state to Transitioning, to perform another measurement
    else
        Run the second stage of a DFT on the full data set
        Perform a byte swap on the data to prepare it for sending
```

TABLE 1-continued

```
            Send the final computed data to the analyzers CPU
        }
        Wait for Transmission to complete
        {
            if the final byte has been sent
                reset the comm port buffers
            Set next state to Waiting for Command
        }
      }
    }
}
//========== Supporting Routines ==================
DoTimerError ( )
{
    Increment the error counter
    if the error counter has reached the soft limit
        Adjust the timer setting
        Set next state to Transitioning to rerun measurement
    if the error counter has reached the hard limit
        Synchronization failed to lock on
        Set next state to Waiting for Command to start over
}
SetUpTimer( )
{
    Configure for oversampling measurement
    Set the timer counter
    if the injection frequency is above Level 1
        Set up for Level 1 EquivalentTimeSampling
    if the injection frequency is above Level 2
        Set up for Level 2 EquivalentTimeSampling
    if the injection frequency is above Level 3
        Set up for Level 3 EquivalentTimeSampling
    if the injection frequency is above Level 4
        Set up for Level 4 EquivalentTimeSampling
    if we are EquivalentTimeSampling
        adjust the timer counter
        Set interrupts for EquivalentTimeSampling
    else
        Set interrupt for oversampling
    Estimate the predicted number of samples to be obtained for this measurement
    Load the timer
}
StoreToHoldingBuffer
{
    for each sample
        store the voltage error value
        convert the PWM value to standard level value
        store the PWM value
}
CompensateForDfraLatency
{
    Compute an adjustment factor based on injection frequency, number of total samples
    and
    Latency time of the Digital FRA interface
    if we are EquivalentTimeSampling
        add additional adjustment to adjustment factor based on Digital FRA
        EquivalentTimeSampling
        Latency time
    Shift the data set in memory by the computed adjustment factor
    Any data that shifts past the end of the buffer must be moved to the other end of the
    buffer
}
CompensateForTargetLatency
{
    Compute an adjustment factor based on injection frequency, number of total samples
    and
    Latency time target error value
    Shift the data set in memory by the computed adjustment factor
    Any data that shifts past the end of the buffer must be moved to the other end of the
    buffer
    Compute an adjustment factor based on injection frequency, number of total samples
    and
    Latency time target PWM value
```

TABLE 1-continued

```
    Shift the data set in memory by the computed adjustment factor
    Any data that shifts past the end of the buffer must be moved to the other end of the
    buffer
}
ScalePwnAndError
{
for each sample
    rescale the error value to a voltage level
    rescale the PWM value to a voltage level
}
RunDFT_Stage1
{
    Perform the first half of a Discrete Fourier Transform on the sampled data
}
RunDFT_Stage2
{
    Perform the second half of a Discrete Fourier Transform on the sampled data
}
//=========== Interrupt Handlers ==================
OverSamplingTimerInterruptHandler
{
    if interrupts have stabilized
        Toggle the sync signal to the target
    else
        Turn of the Timer
}
    OverSamplingFraSyncInterruptHandler
{
    if timer is stopped
        start timer
    else
        stop timer
        store number of sync pulses
}
EquivalentTimeSamplingTimerInterruptHandler
{
    Toggle the sync signal to the target
    If the FRA sync signal has set to high state
        If we are on an even number of toggles
            If the number of toggles is greater than the estimated number of toggles
                If we are currently sampling data
                    Stop the timer
                    Save the number of triggers that occurred
    Increment the number of toggles
}
EquivalentTimeSamplingFraSyncInterruptHandler
{
    If the interrupts have stabilized properly
        Start the timer
}
```

In some embodiments, the UUT 112 may host a small footprint of software code, in tandem with UUT 112's own software that may process synchronization signals, capture sampling data and send data samples to the DFRA 110 for processing.

In some embodiments, two values of data are normally captured by the DFRA 110:

1. The error level, designated by 'e', which is generated by an error detection system within the processor 114. This usually includes an analog-to-digital converter circuit that either generates the error value directly or feeds the values into a software algorithm to compute the error value.

2. The modulation level, designated by 'U', which is generated by a filter engine within the processor 114. This can include either a hardware filter engine circuit that either generates the modulation value directly or can include a software algorithm to compute the modulation value.

Actual data sample capture may be performed through an optimized software routine attached to a high priority interrupt on the processor 114, for example, the Non-Maskable Interrupt.

Additional aspects and example embodiments of the processor code for the processor 114 are described in Table 2 below:

TABLE 2

```
//=========== Interrupt Handler ==================
InterruptServiceRoutine_Sampler
{
Store the Error value into memory
Store the PWM value into memory
Increment the memory pointer
If we reach the end of the buffer
    Shut off the interrupt
}
//=========== Main Routines ==================
InitializeSampling
{
Clear the buffer
Initialize the communication interfaces
Initialize the message structures
Set memory pointer to point to beginning of buffer
Configure the Interrupt Service Routine managing the Sampler
}
SamplingHandler
{
```

TABLE 2-continued

```
If a message transfer code is detected
{
    if we are sending data
        Shut off the transmitter
    else
        Read the new message
        Check the command code
        If the command is to start sampling
            Reset the memory pointer
            initialize variables
            Enable the synchronization interrupt
            Send message to FRA to acknowledge command
        if the command is to stop sampling
            Disable the synchronization interrupt
            Send message to FRA to acknowledge command
        if the command is to check for result being ready
            Send message to FRA to acknowledge that data is ready
            Reset the memory pointer
        if the command is to request a data block
            Set state to send data
        if the command is to request baseline data
            Grab baseline parameters and store them into the message
            block
            Send the message block to the Digital FRA
            Reset the memory pointer
}
if we are sending data
    Load the next data block into the message queue
    Update queue pointer
    Send the message to the Digital FRA
else
    Send the final message block with counter information
If a send is in progress
    return TRUE
else
    return FALSE
}
```

In some embodiments, the bus 118 is implemented as an I²C bus. Alternative data connection and transfer methods may be employed, however.

Figure 2:
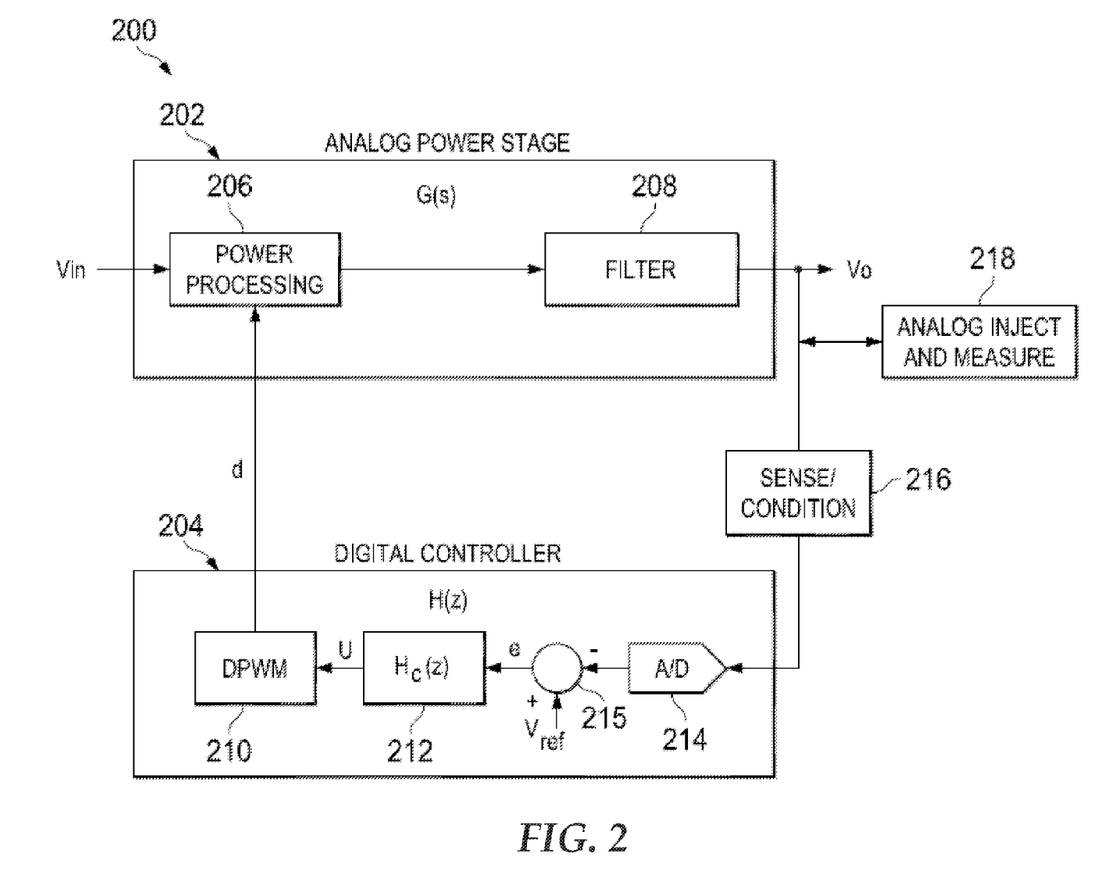
FIG. 2 depicts a diagram of an exemplary digital control loop in a frequency response analysis system according to some embodiments.

Turning now to FIG. 2, a diagram of an exemplary digital control loop is illustrated. The digital control loop of a power supply 200 includes an analog section 202 and a digital controller 204. In an embodiment, the power supply 200 can be the UUT 112 of FIG. 1 above. Moreover, while FIG. 2 is described with respect to a power supply the digital control loop can also be located with a motion controller without varying from the scope of the disclosure. Analog signals are injected and measured at 218 in a manner similar to that discussed above. In particular, generator 104 of FIG. 1, can inject a sine wave into the digital control loop of the power supply 200. The analog power section 202 includes a power switch module 206 and an output filter 208. The digital controller 204 includes an Analog to Digital Converter (ADC) 214 to sense the output from sensor 216, a compensator 212, and a pulse width modulator (PWM) pulse train generator 210. The compensator 212 receives an output e from the error generator 215 and provides an input U to the PWM 210. As can be appreciated, to measure the performance of the compensator 212, the signals e and U need to be measured. However, since these measurement points exist within the digital controller 204, they are not available with analog measuring techniques.

Figure 3:
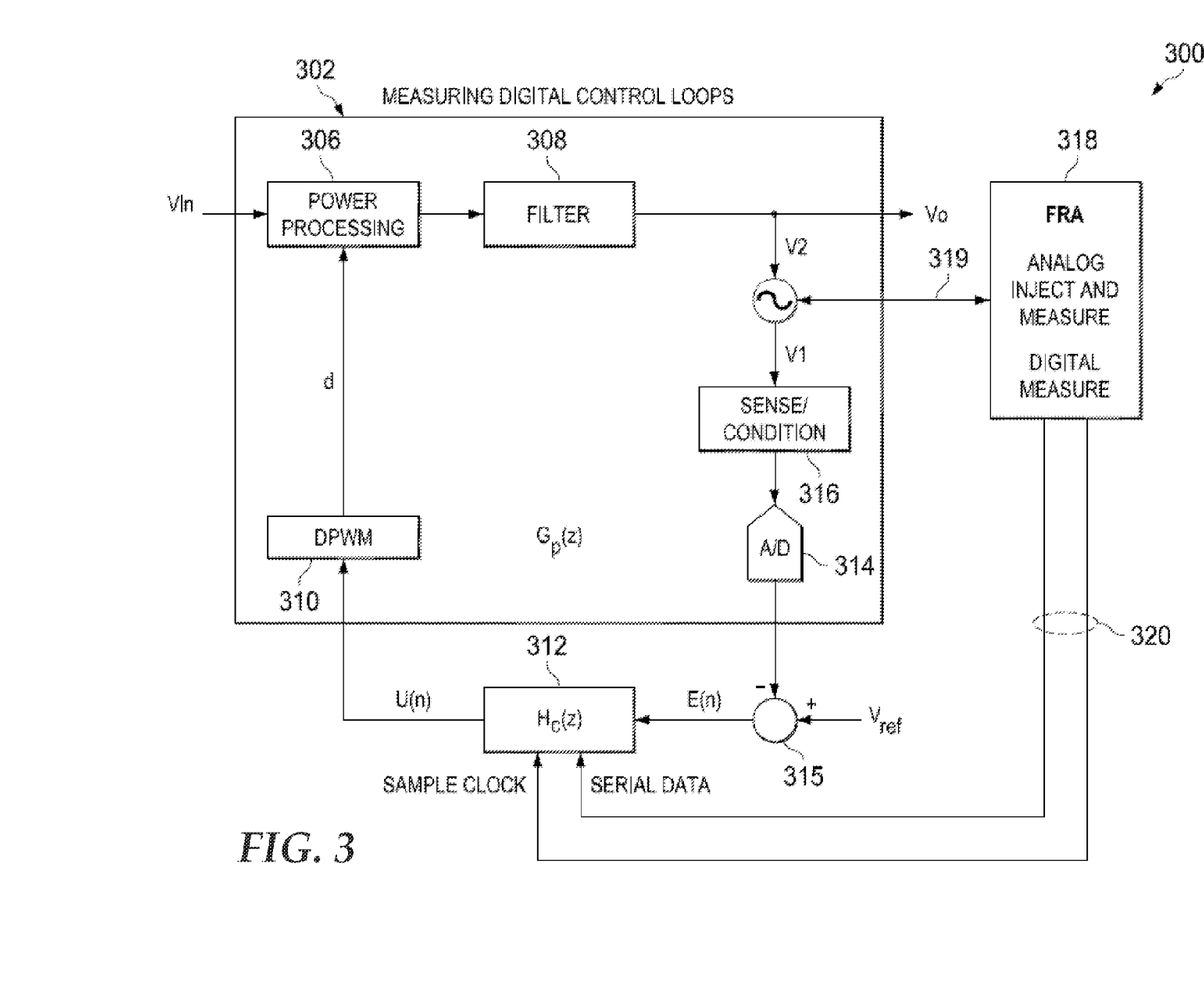
FIG. 3 depicts a diagram of an exemplary digital control loop in a digital frequency response analysis system according to some embodiments.

As shown in FIG. 3, embodiments, however, introduce the ADC and the PWM from the digital controller to the analog stage as part of its transfer function. That is, timing delays resulting between the PWM and the power processing block may be included in the transfer function for the analog stage.

As shown in FIG. 3, the system now includes an analog section 302 having power processing 306, filter 308, PWM 310, ADC 314, and sensor 316. The FRA 318 injects and measures analog portions at 319 and performs digital injection and measurement at 320.

Thus, four measurement points are provided: two points at 319, and two points at 320. The injection and analog measurements points 319 (V1, V2) remain the same as they do for an analog-based system and still can be used to plot a total feedback loop gain and phase. In an embodiment, a generator of the FRA 318, such as generator 104 of FIG. 1, injects an analog signal, such as a sine wave, at 319. In this embodiment, the use of a sine wave is to prevent an introduction of harmonics into the system that can be caused by trapezoidal and square wave signals as these signals approach the Nyquist frequency of the modulator. As described above with respect to FIG. 1, one or more analog channels of the FRA 318 can receive analog measurements at 319 in response to injecting the analog signal into the analog section 302 of the control loop.

The system 300 of FIG. 3, however, additionally includes two digital points, e and U, that allow for measurement of the transfer function Hc(z) of the compensator 312. As described above, digital values can be provided from the two digital points, e and U, to a DFRA of the FRA 318. In an embodiment, the analog signals received at 319 can be correlated with the digital signals at 320 to determine the transfer function for different gain blocks, or sections of the control loop in FIG. 3. In an embodiment, a plant can be a specific part of the control loop. For example, a plant can be the part or section of the control loop that is being controlled, such as the power stage. Further, using these 4 points, the power stage and compensator gain and phase can be measured and plotted separately. Although the ADC 314 is now between its own two measurement points, its plot is generally flat with unity gain and zero phase because the sampling speed of the ADC 314 is normally significantly faster than the switching frequency, and so it can be disregarded in most cases.

Additional aspects and example embodiments of a DFRA are described in the U.S. Provisional Patent Application No. 61/951,407 filed Mar. 11, 2014 which is incorporated herein in its entirety.

Advantageously, embodiments including the reference channel 105 provided as part of the overall system, give the ability to make direct correlations between analog data and digital data. In addition, through use of the reference channel 105, embodiments can directly measure and plot the control-to-output stage (power stage) of the feedback loop. Embodiments can further allow software correction of the digital data due to time latency of the UUT 112's power supply and the DFRA 110 with respect to each other and with respect to the analog channels 108. Finally, the synchronization signal 116 to the UUT 112 advantageously controls the sampling of data within the target under test.

Although the disclosure has been described with respect to specific embodiments thereof, these embodiments are merely illustrative, and not restrictive of the disclosure. The description herein of illustrated embodiments of the disclosure, including the description in the Abstract and Summary, is not intended to be exhaustive or to limit the disclosure to the precise forms disclosed herein (and in particular, the inclusion of any particular embodiment, feature or function within the Abstract or Summary is not intended to limit the scope of the disclosure to such embodiment, feature or function). Rather, the description is intended to describe illustrative embodiments, features and functions in order to provide a person of ordinary skill in the art context to understand the disclosure without limiting the disclosure to any particularly described embodiment, feature or function, including any such embodiment feature or function described in the Abstract or Summary. While specific embodiments of, and examples for, the disclosure are described herein for illustrative purposes only, various equivalent modifications are possible within the spirit and scope of the disclosure, as those skilled in the relevant art will recognize and appreciate. As indicated, these modifications may be made to the disclosure in light of the foregoing description of illustrated embodiments of the disclosure and are to be included within the spirit and scope of the disclosure. Thus, while the disclosure has been described herein with reference to particular embodiments thereof, a latitude of modification, various changes and substitutions are intended in the foregoing disclosures, and it will be appreciated that in some instances some features of embodiments of the disclosure will be employed without a corresponding use of other features without departing from the scope and spirit of the disclosure as set forth. Therefore, many modifications may be made to adapt a particular situation or material to the essential scope and spirit of the disclosure.

Reference throughout this specification to "one embodiment," "an embodiment," or "a specific embodiment" or similar terminology means that a particular feature, structure, or characteristic described in connection with the embodiment is included in at least one embodiment and may not necessarily be present in all embodiments. Thus, respective appearances of the phrases "in one embodiment," "in an embodiment," or "in a specific embodiment" or similar terminology in various places throughout this specification are not necessarily referring to the same embodiment. Furthermore, the particular features, structures, or characteristics of any particular embodiment may be combined in any suitable manner with one or more other embodiments. It is to be understood that other variations and modifications of the embodiments described and illustrated herein are possible in light of the teachings herein and are to be considered as part of the spirit and scope of the disclosure.

In the description herein, numerous specific details are provided, such as examples of components and/or methods, to provide a thorough understanding of embodiments of the disclosure. One skilled in the relevant art will recognize, however, that an embodiment may be able to be practiced without one or more of the specific details, or with other apparatus, systems, assemblies, methods, components, materials, parts, and/or the like. In other instances, well-known structures, components, systems, materials, or operations are not specifically shown or described in detail to avoid obscuring aspects of embodiments of the disclosure. While the disclosure may be illustrated by using a particular embodiment, this is not and does not limit the disclosure to any particular embodiment and a person of ordinary skill in the art will recognize that additional embodiments are readily understandable and are a part of this disclosure.

Embodiments discussed herein can be implemented in a standalone computer or in a computer communicatively coupled to a network (for example, the Internet). As is known to those skilled in the art, a suitable computer can include a central processing unit ("CPU"), at least one read-only memory ("ROM"), at least one random access memory ("RAM"), at least one hard drive ("HD"), and one or more input/output ("I/O") device(s). The I/O devices can include a keyboard, monitor, printer, electronic pointing device (for example, mouse, trackball, stylus, touch pad, etc.), or the like.

ROM, RAM, and HD are computer memories for storing computer-executable instructions executable by the CPU or capable of being compiled or interpreted to be executable by the CPU. Suitable computer-executable instructions may reside on a computer readable medium (e.g., ROM, RAM, and/or HD), hardware circuitry or the like, or any combination thereof. Within this disclosure, the term "computer readable medium" or is not limited to ROM, RAM, and HD and can include any type of data storage medium that can be read by a processor. For example, a computer-readable medium may refer to a data cartridge, a data backup magnetic tape, a floppy diskette, a flash memory drive, an optical data storage drive, a CD-ROM, ROM, RAM, HD, or the like. The processes described herein may be implemented in suitable computer-executable instructions that may reside on a computer readable medium (for example, a disk, CD-ROM, a memory, etc.). Alternatively, the computer-executable instructions may be stored as software code components on a direct access storage device array, magnetic tape, floppy diskette, optical storage device, or other appropriate computer-readable medium or storage device.

Any suitable programming language can be used to implement the routines, methods or programs of embodiments of the disclosure described herein, including C, C++, Java, JavaScript, HTML, or any other programming or scripting code, etc. Other software/firmware/hardware/network architectures may be used. For example, the functions of the disclosed embodiments may be implemented on one computer or shared/distributed among two or more devices. Communications between computers implementing embodiments can be accomplished using any electronic, optical, radio frequency signals, or other suitable methods and tools of communication in compliance with known communications protocols.

Different programming techniques can be employed such as procedural or object oriented. Any particular routine can execute on a single computer processing device or multiple computer processing devices, a single computer processor or multiple computer processors. Data may be stored in a single storage medium or distributed through multiple storage mediums, and may reside in a single database or multiple databases (or other data storage techniques). Although the steps, operations, or computations may be presented in a specific order, this order may be changed in different embodiments. In some embodiments, to the extent multiple steps are shown as sequential in this specification, some combination of such steps in alternative embodiments may be performed at the same time. The sequence of operations described herein can be interrupted, suspended, or otherwise controlled by another process, such as an operating system, kernel, etc. The routines can operate in an operating system environment or as stand-alone routines. Functions, routines, methods, steps and operations described herein can be performed in hardware, software, firmware or any combination thereof.

Embodiments described herein can be implemented in the form of control logic in software, firmware, hardware or a combination thereof. The control logic may be stored in an information storage medium, such as a computer-readable medium, as a plurality of instructions adapted to direct an information processing device to perform a set of steps disclosed in the various embodiments. Based on the disclosure and teachings provided herein, a person of ordinary skill in the art will appreciate other ways and/or methods to implement the disclosure.

It is also within the spirit and scope of the disclosure to implement in software programming or code any of the steps, operations, methods, routines or portions thereof described herein, where such software programming or code can be stored in a computer-readable medium and can be operated on by a processor to permit a computer to perform any of the steps, operations, methods, routines or portions thereof described herein. The disclosure may be implemented by using software programming or code in one or more general purpose digital computers, by using application specific integrated circuits, programmable logic devices, field programmable gate arrays, optical, chemical, biological, quantum or nanoengineered systems, components and mechanisms may be used. In general, the functions of the disclosure can be achieved by any means as is known in the art. For example, distributed or networked systems, components and circuits can be used. In another example, communication or transfer (or otherwise moving from one place to another) of data may be wired, wireless, or by any other means.

A "computer-readable medium" may be any medium that can contain, store, communicate, propagate, or transport the program for use by or in connection with the instruction execution system, apparatus, system or device. The computer readable medium can be, by way of example only but not by limitation, an electronic, magnetic, optical, electromagnetic, infrared, or semiconductor system, apparatus, system, device, propagation medium, or computer memory. Such computer-readable medium shall generally be machine readable and include software programming or code that can be human readable (e.g., source code) or machine readable (e.g., object code). Examples of non-transitory computer-readable media can include random access memories, read-only memories, hard drives, data cartridges, magnetic tapes, floppy diskettes, flash memory drives, optical data storage devices, compact-disc read-only memories, and other appropriate computer memories and data storage devices. In an illustrative embodiment, some or all of the software components may reside on a single server computer or on any combination of separate server computers. As one skilled in the art can appreciate, a computer program product implementing an embodiment disclosed herein may comprise one or more non-transitory computer readable media storing computer instructions translatable by one or more processors in a computing environment.

A "processor" includes any, hardware system, mechanism or component that processes data, signals or other information. A processor can include a system with a general-purpose central processing unit, multiple processing units, dedicated circuitry for achieving functionality, or other systems. Processing need not be limited to a geographic location, or have temporal limitations. For example, a processor can perform its functions in "real-time," "offline," in a "batch mode," etc. Portions of processing can be performed at different times and at different locations, by different (or the same) processing systems.

It will also be appreciated that one or more of the elements depicted in the drawings/figures can also be implemented in a more separated or integrated manner, or even removed or rendered as inoperable in certain cases, as is useful in accordance with a particular application. Additionally, any signal arrows in the drawings/figures should be considered only as exemplary, and not limiting, unless otherwise specifically noted.

As used herein, the terms "comprises," "comprising," "includes," "including," "has," "having," or any other variation thereof, are intended to cover a non-exclusive inclusion. For example, a process, product, article, or apparatus that comprises a list of elements is not necessarily limited only those elements but may include other elements not expressly listed or inherent to such process, process, article, or apparatus.

Furthermore, the term "or" as used herein is generally intended to mean "and/or" unless otherwise indicated. For example, a condition A or B is satisfied by any one of the following: A is true (or present) and B is false (or not present), A is false (or not present) and B is true (or present), and both A and B are true (or present). As used herein, a term preceded by "a" or "an" (and "the" when antecedent basis is "a" or "an") includes both singular and plural of such term (i.e., that the reference "a" or "an" clearly indicates only the singular or only the plural). Also, as used in the description herein, the meaning of "in" includes "in" and "on" unless the context clearly dictates otherwise.

The above-disclosed subject matter is to be considered illustrative, and not restrictive, and the appended claims are intended to cover any and all such modifications, enhancements, and other embodiments that fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A method comprising:
   providing a output signal to a unit under test via a first external terminal of a frequency response analyzer;
   receiving, at a first channel module of the frequency response analyzer, analog data in response to providing the output signal;
   providing a first synchronization signal to a digital frequency response analyzer (DFRA) of the frequency response analyzer;
   measuring, at a reference channel module, phase data of the output signal;
   providing, by the DFRA, a digital command signal based on the first synchronization signal;
   receiving, at the DFRA, digitized analog data in response to providing the digital commands;
   correlating the received digitized analog data to the received analog data based on the phase data; and
   determining transfer function of a plant at the unit under test based on the correlation of the received digitized analog data and the received analog data.

2. The method of claim 1 wherein further comprising:
   generating, at a signal generator, an analog test signal;
   determining, at the signal generator, the first synchronization signal identifying a period of the test signal;
   generating the output signal based on the analog test signal; and
   providing the output signal to the first external terminal of the frequency response analyzer.

3. The method of claim 1, wherein the first synchronization signal indicates a state change at each zero-cross of the output signal.

4. The method of claim 1 further comprising:
   providing a second synchronization signal to the unit under test, wherein the second synchronization signal is a series of pulses, and wherein the series of pulses begin with a transition of the first synchronization signal and end with a subsequent transition of the first synchronization signal for signal rates below 500 Hertz.

5. The method of claim 1 wherein the first synchronization signal is a digital signal that is frequency and phase locked to the output signal.

6. The method of claim 1 wherein the unit under test is a power supply device.

7. The method of claim 1 further comprising:
providing a second synchronization signal to the unit under test, wherein the second synchronization signal is a series of pulses, and wherein the series of pulses begin with a transition of the first synchronization signal and end with a subsequent transition of the first synchronization signal that coincides with a transition of the second synchronization signal for signal rates above 500 Hertz.

8. A method comprising:
providing a output signal to a unit under test via a first external terminal of a frequency response analyzer;
receiving, at a first channel module of a frequency response analyzer, analog data in response to providing the output signal;
injecting an analog signal into a feedback loop of a unit under test;
receiving, at a digital frequency response analyzer (DFRA) of the frequency response analyzer, digitized analog data from the unit under test, the digitized analog data being based upon the analog signal;
correlating the digitized analog data to the analog result data based on phase data of the output signal; and
determining transfer function of a plant of the unit under test based on the digitized analog data.

9. The method of claim 8 further comprising:
measuring an error of the plant of a digital controller of the unit under test in response to the injection of the analog signal.

10. The method of claim 8, wherein determining the transfer function of the plant comprises:
determining a transfer function of the plant for the unit under test based on the correlation of the digitized analog data and the analog result data.

11. The method of claim 8, further comprising:
providing, to the DFRA, a first synchronization signal;
providing a digital command to a unit under test; and
providing a second synchronization signal to the unit under test, wherein the second synchronization signal is based on the first synchronization signal.

12. The method of claim 11, wherein the first synchronization signal indicates a state change at each zero-cross of the output signal.

13. The method of claim 11 wherein the first synchronization signal is a digital signal that is frequency and phase locked to the output signal.

14. The method of claim 8, wherein the digitized analog data includes error information associated with the unit under test, and information about a pulse width modulated signal of the unit under test.

15. A frequency response analyzer comprising:
a signal generator comprising an input, a first output to provide an output signal to a unit under test, and a second output to provide a first synchronization signal;
a reference channel module comprising an input coupled to the first output of the signal generator, and an output to provide phase information data of the output signal; and
a digital frequency response analyzer (DFRA) comprising a first input to receive the first synchronization signal, and a second input to receive digitized analog data from the unit under test, a processor of the frequency response analyzer to correlate the received digitized analog data to received analog data based on the phase, and to determine transfer function plant of the unit under test based on the correlation of the received digitized analog data and the received analog data.

16. The frequency response analyzer of claim 15, wherein the first synchronization signal indicates a state change at each zero-cross of the output signal.

17. The frequency response analyzer of claim 15, wherein the output signal is an analog wave signal.

18. The frequency response analyzer of claim 15, the DFRA further comprising an output to provide a second synchronization signal to the unit under test, wherein the second synchronization signal is a series of pulses, and wherein the series of pulses begin with a transition of the first synchronization signal and end with a subsequent transition of the first synchronization signal for signal rates below 500 Hertz.

19. The frequency response analyzer of claim 15, the DFRA further comprising an output to provide a second synchronization signal to the unit under test, wherein the second synchronization signal is a series of pulses, and wherein the series of pulses begin with a transition of the first synchronization signal and end with a subsequent transition of the first synchronization signal that coincides with a transition of the second synchronization signal for signal rates above 500 Hertz.

20. The frequency response analyzer of claim 15, wherein the DFRA further comprises an output to provide a digital command to the unit under test, wherein commands initiate data sampling within the unit under test.

* * * * *